(12) United States Patent
Wang

(10) Patent No.: US 11,894,250 B2
(45) Date of Patent: Feb. 6, 2024

(54) METHOD AND SYSTEM FOR RECOGNIZING AND ADDRESSING PLASMA DISCHARGE DURING SEMICONDUCTOR PROCESSES

(71) Applicant: Taiwan Semiconductor Manufacturing Co., Ltd., Hsinchu (TW)

(72) Inventor: Chih-Yu Wang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 48 days.

(21) Appl. No.: 16/836,639

(22) Filed: Mar. 31, 2020

(65) Prior Publication Data

US 2021/0305074 A1    Sep. 30, 2021

(51) Int. Cl.
    *H01L 21/67* (2006.01)
    *G06T 1/00* (2006.01)
    *G06T 7/00* (2017.01)
    *H01J 37/32* (2006.01)

(52) U.S. Cl.
    CPC ...... *H01L 21/67253* (2013.01); *G06T 1/0014* (2013.01); *G06T 7/0004* (2013.01); *H01J 37/32944* (2013.01); *H01L 21/67017* (2013.01); *H01L 21/67288* (2013.01); *G06T 2207/10016* (2013.01); *G06T 2207/20081* (2013.01); *H01J 2237/24507* (2013.01)

(58) Field of Classification Search
    CPC ......... H01L 21/67253; H01L 21/67017; H01L 21/67288; G06T 1/0014; G06T 7/0004; G06T 2207/10016; G06T 2207/20081; G06T 2207/10024; G06T 2207/10048; G06T 2207/30148; G06T 1/20; H01J 37/32944; H01J 2237/24507; H01J 37/32935
    See application file for complete search history.

(56) References Cited

U.S. PATENT DOCUMENTS

| 10,957,521 B2 * | 3/2021 | Wang | H01J 37/32091 |
| 2002/0094685 A1 * | 7/2002 | Nakata | G01N 21/94 |
| | | | 438/689 |

(Continued)

FOREIGN PATENT DOCUMENTS

| JP | H06124902 A * | 5/1996 | .......... H01L 21/205 |
| WO | WO-2005062337 A1 * | 7/2005 | .............. H05H 1/46 |

(Continued)

*Primary Examiner* — Mohammed Shamsuzzaman
(74) *Attorney, Agent, or Firm* — Seed IP Law Group LLP

(57) ABSTRACT

A plasma discharge detection system detects undesirable plasma discharge events within a semiconductor process chamber. The plasma discharge detection system includes one or more cameras positioned around the semiconductor process chamber. The cameras capture images from within the semiconductor process chamber. The plasma discharge detection system includes a control system that receives the images from the cameras. The control system analyzes the images and detects plasma discharge within the semiconductor process chamber based on the images. The control system can adjust a semiconductor process in real time responsive to detecting the plasma discharge.

15 Claims, 6 Drawing Sheets

(56) References Cited

U.S. PATENT DOCUMENTS

| | | | | |
|---|---|---|---|---|
| 2015/0311129 A1* | 10/2015 | Miller | ................ | H01L 21/3065 |
| | | | | 156/345.25 |
| 2017/0062290 A1* | 3/2017 | Miller | ................ | H01L 21/3065 |
| 2018/0040460 A1* | 2/2018 | Gottscho | ........... | H01J 37/32972 |
| 2020/0200606 A1* | 6/2020 | Yurt | ......................... | G01J 3/06 |
| 2020/0371046 A1* | 11/2020 | Wang | ................ | G01N 21/8422 |
| 2020/0393242 A1* | 12/2020 | Vishwanath | ...... | H01L 21/67253 |

FOREIGN PATENT DOCUMENTS

| | | | | |
|---|---|---|---|---|
| WO | WO-2021021501 A1 * | 2/2021 | ....... | H01L 21/67742 |
| WO | WO-2021061541 A1 * | 4/2021 | ............. | C23C 16/52 |

* cited by examiner

METHOD AND SYSTEM FOR RECOGNIZING AND ADDRESSING PLASMA DISCHARGE DURING SEMICONDUCTOR PROCESSES

BACKGROUND

Technical Field

The present disclosure relates to the field of semiconductor processing. The present disclosure relates more particularly to detecting abnormal plasma discharge during a semiconductor process.

Description of the Related Art

Fabrication of integrated circuits is typically accomplished by performing a large number of processing steps on semiconductor wafers. The processing steps typically result in the formation of a large number of transistors in highly complex arrangements in conjunction with a semiconductor substrate. The processing steps also result in the formation of dielectric layers, metal interconnects, vias, plugs, and other integrated circuit structures and components.

Many semiconductor processes utilize plasmas. During plasma-based semiconductor processes, it is possible that undesirable plasma discharge will occur within the processing environment. Undesirable plasma discharge can include arcing, corona discharge, or sparks. The undesirable plasma discharge may negatively affect the semiconductor processes and may even directly damage semiconductor wafers. The result is that affected semiconductor wafers may need to be discarded.

DETAILED DESCRIPTION

Figure 1:
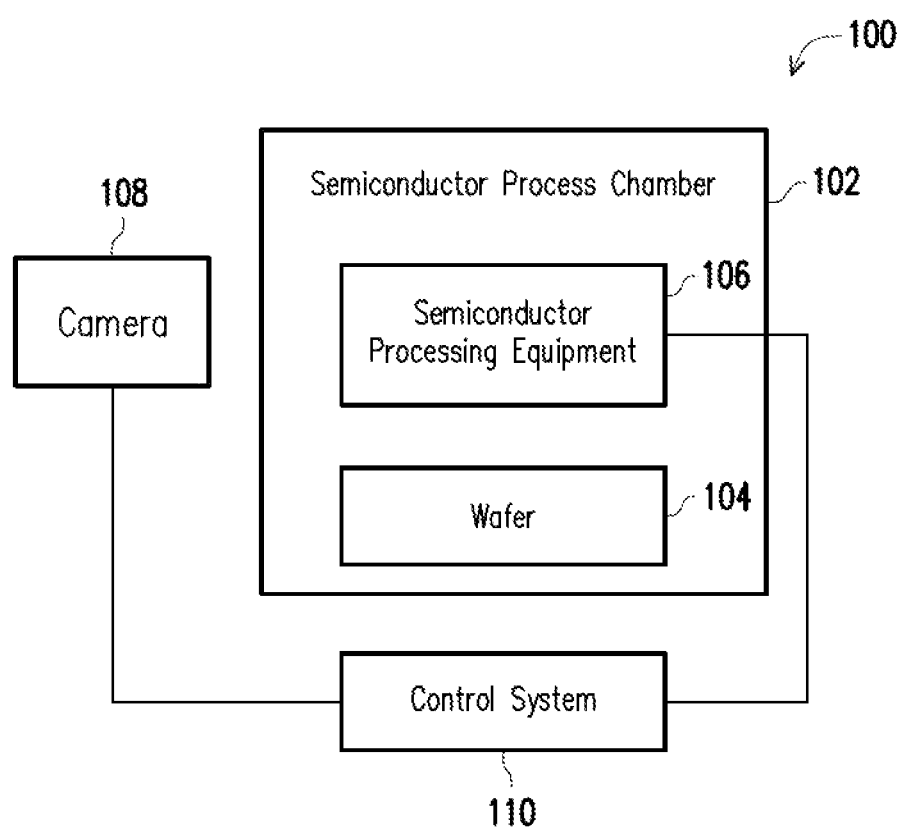
FIG. 1 is a block diagram of a semiconductor processing system including a discharge detection system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure utilize plasma detection techniques to improve semiconductor processes.

Embodiments of the present disclosure capture video streams of a semiconductor process chamber, analyze the video streams with a control system, and identify abnormal plasma discharge within the semiconductor process chamber. The control system then adjusts parameters of the semiconductor process to reduce or eliminate abnormal plasma discharge in real time responsive to detection of the abnormal plasma discharge. This results in semiconductor processes that produce better uniformity in semiconductor wafers and their integrated circuits. Additionally, wafer yields are greatly increased because wafers are not damaged or scrapped due to abnormal plasma discharge.

FIG. 1 is a block diagram of a semiconductor processing system 100, according to an embodiment. The semiconductor processing system 100 includes a semiconductor process chamber 102 for performing one or more semiconductor processes on a wafer 104. The semiconductor processing system 100 is configured to detect undesirable plasma discharge within the semiconductor process chamber 102.

In one embodiment, the semiconductor process chamber 102 is utilized to perform one or more semiconductor processes on the wafer 104. The wafer 104 is a semiconductor wafer. Typically, semiconductor wafers undergo a large number of processes during fabrication. These processes can include thin-film depositions, photoresist patterning, etching processes, dopant implantation processes, annealing processes, and other types of processes. After all of the processing steps are complete, the wafer 104 will be diced into a plurality of individual integrated circuits.

In one embodiment, the semiconductor process chamber 102 is utilized to perform one or more plasma-based semiconductor processes on the wafer 104. The plasma-based processes can include generating a plasma within the semiconductor process chamber 102. The plasma can assist in a thin-film deposition process, an etching process, a doping process, an ashing process, a polymerization process, or other types of processes.

The semiconductor processing system 100 includes semiconductor processing equipment 106. The semiconductor processing equipment 106 assists in performing the semiconductor processes. The semiconductor processing equipment 106 can include equipment that assists in thin-film deposition processes, etching processes, ion implantation processes, annealing processes, photolithography processes, and other types of processes. The semiconductor processing equipment 106 can include components for generating a plasma within the semiconductor process chamber 102. Some of the semiconductor processing equipment 106 may be positioned entirely within the semiconductor process chamber 102. Some of the semiconductor processing equipment 106 may be positioned partially within the semiconductor process chamber 102 and partially external to the semiconductor process chamber 102. Some of the semiconductor processing equipment 106 may be positioned entirely external to the semiconductor process chamber 102.

The semiconductor processing equipment 106 can include electrical components for generating electric fields, voltages, magnetic fields, electrical signals, or other types of electrical effects. Accordingly, the semiconductor processing equipment 106 can include electrodes, wires, radiofrequency power sources, transmitters, receivers, or other types of electrical equipment that may be utilized in semiconductor processes.

The semiconductor processing equipment 106 can include equipment for managing gas or flow within the semiconductor process chamber 102. The processing equipment can include components for introducing gasses or fluids into the semiconductor process chamber 102, for removing gasses or fluids from the semiconductor process chamber, and for monitoring and controlling the flow, presence, or composition of gasses within the semiconductor process chamber 102. The semiconductor processing equipment 106 can include equipment for retaining a selected pressure within the interior of the semiconductor process chamber 102.

While performing processing steps on the semiconductor wafer 104, undesirable plasma discharge may occur within the semiconductor process chamber 102. The undesirable plasma discharge can include arcing, corona discharge, or sparking. Arcing is the momentary flow of high electrical current within the semiconductor process chamber 102, typically between two conductive elements within the semiconductor process chamber 102, or between a conductor and the semiconductor wafer 104. The arcing can occur due to the buildup of electrostatic charge between objects or materials within the semiconductor process chamber 102. Electrostatic charges can build up on electrodes within the semiconductor process chamber 102, on the wafer 104, on walls of the semiconductor process chamber 102, on process equipment within the semiconductor process chamber 102, in gases present within the semiconductor process chamber 102, or in other ways. When an electric field becomes large enough due to the buildup of electrostatic charge, or due to other factors, arcing can occur.

In corona discharge, a current flows from a conductor with a high potential into a fluid, such as air, by ionizing the fluid so as to create a region of plasma around the electrode. The ions generated eventually pass the charge to nearby areas of lower potential, or recombine to form neutral gas molecules.

If arcing or corona discharge occurs in the vicinity of the semiconductor wafer 104, it is possible that the semiconductor wafer 104 will be damaged. For example, if arcing results in the flow of large currents between a portion of the semiconductor wafer 104 and another object or material within the semiconductor process chamber 102, then the currents can damage the semiconductor wafer 104. If the semiconductor wafer 104 is damaged, it is possible that some integrated circuit dies that result from the semiconductor wafer 104 will not function properly. In some cases, the semiconductor wafer 104 may be sufficiently damaged that the entire semiconductor wafer 104 will need to be discarded. This results in a significant loss of time, materials, and money.

In one embodiment, the semiconductor processing system 100 of FIG. 1 is able to detect and control unwanted plasma discharge in the semiconductor process chamber 102 in real time. The semiconductor processing system 100 includes a plasma discharge detection system. The plasma discharge detection system includes one or more cameras 108 and a control system 110. The cameras 108 and the control system 110 cooperate together to detect arcing within the semiconductor process chamber 102.

In one embodiment, the one or more cameras 108 are positioned to capture video images of an interior of a semiconductor process chamber 102. The one or more cameras 108 are configured to continuously capture a video stream of an interior of the semiconductor process chamber 102 during a semiconductor process. The images, in the form of the video stream, are utilized to detect plasma discharge within the semiconductor process chamber 102.

In one embodiment, the one or more cameras 108 are positioned outside of the semiconductor process chamber 102. The semiconductor process chamber 102 can include one or more windows or apertures through which light can pass from the interior of the semiconductor process chamber 102 to the one or more cameras 108. Alternatively, the walls of the semiconductor process chamber 102 may be transparent, thereby enabling the one or more cameras 108 to capture images of the interior of the semiconductor process chamber 102. In this way, the one or more cameras 108 can capture a video stream of the interior of the semiconductor process chamber 102.

In one embodiment, the semiconductor processing system 100 includes a plurality of cameras positioned at various locations around the semiconductor process chamber 102. In particular, the plurality of cameras 108 can be arranged such that images of the interior of the semiconductor process chamber 102 can be captured from a variety of angles. Additionally, or alternatively, the plurality of cameras 108 can be arranged such that individual cameras or groups of cameras can be positioned to capture images of a particular portion of the semiconductor process chamber 102.

In one embodiment, the one or more cameras 108 are positioned in an interior of the semiconductor process chamber 102. The one or more cameras 108 can be positioned at selected locations within the semiconductor process chamber 102 to capture images from a variety of angles and positions. Individual cameras or groups of cameras 108 can be positioned to capture images of particular areas of the semiconductor process chamber 102.

In one embodiment, the one or more cameras 108 are configured to enable identification of the locations of plasma discharge within the semiconductor process chamber 102. The video streams captured by the one or more cameras 108 enable the control system 110 to determine the exact location of arcing and other types of plasma discharge events within the semiconductor process chamber 102.

In one embodiment, the cameras 108 include a variety of types of cameras, each configured to capture images in a particular spectrum of light. For example, the first type of camera 108 may capture light primarily in the visible spectrum. A second type of camera 108 may capture light primarily in the infrared spectrum. The third type of camera 108 may capture light primarily in the ultraviolet spectrum. The various types of cameras may capture overlapping spectra of light. Cameras 108 can include multiple cameras of each type.

In one embodiment, the control system 110 is communicatively coupled to the cameras 108. The cameras 108 capture a stream of images and provide image data to the control system 110. The image data can correspond to a digitized representation of the stream images captured by the cameras 108. As will be set forth in more detail below, the cameras 108 can be coupled to or can include filters and signal processing circuitry that can format or otherwise process the image data before sending it to the control system 110.

In one embodiment, the control system 110 receives the images, or image data from the cameras 108 or from intermediate signal processors or transmitters. The control system 110 processes the images and determines whether plasma discharge has occurred within the semiconductor process chamber 102 based on the images. Accordingly, the control system 110 can determine whether or not plasma discharge has occurred within the semiconductor process chamber 102 by analyzing the images provided by the one or more cameras 108.

The control system 110 can receive the images wirelessly from the cameras 108. The cameras 108 may be coupled to the control system 110 by one or more wireless connection protocols including, but not limited to Bluetooth, Wi-Fi, or ZigBee protocols. Other wireless communication protocols can be utilized without departing from the scope of the present disclosure. Accordingly, the semiconductor processing system 100 can include wireless transceivers or transmitters coupled to the cameras 108 positioned around or within the semiconductor process chamber 102. The wireless transceivers or transmitters can transmit the images to the control system 110.

In one embodiment, the semiconductor processing system 100 includes power sources coupled to the cameras 108 and, if present, to the wireless communication systems coupled to the cameras 108. The power sources can include batteries or wired connections to stable power supplies. In one embodiment, the semiconductor processing system 100 includes energy harvesting devices for recharging batteries or for otherwise powering the cameras 108 and the wireless communication systems. The energy harvesting devices can harvest energy from heat, light, soundwave vibrations, or various types of motion.

In one embodiment, the cameras 108 are connected to the control system 110 by a wired connection. Accordingly, the cameras 108 can communicate with the control system 110 via a wired connection that passes to the control system 110.

In one embodiment, when the control system 110 receives images from the cameras 108, the control system 110 may filter the images. Accordingly, the control system 110 can include one or more filters. The images are passed to the filters in order to remove optical characteristics that do not assist in identifying plasma discharge. The filters may also remove certain kinds of images. After the images have been passed through the one or more filters, the images are ready for further processing and analysis by the control system 110.

In one embodiment, the images can be passed through filters prior to being transmitted to the control system 110. Accordingly, the cameras 108 can be coupled to one or more electrical filters or other circuitry to remove unwanted optical artifacts, enhance particular optical characteristics, or reduce noise prior to transmitting the images to the control system 110. This enables the control system 110 to more readily identify unwanted plasma discharge based on the images.

In one embodiment, the control system 110 includes an analysis model. The analysis model is trained with a machine learning process in order to identify arcing within the semiconductor process chamber 102. The analysis model can analyze the images, or data based on the images, in order to identify arcing within the semiconductor process chamber 102.

In one embodiment, the machine learning process is a supervised machine learning process. Supervised machine learning processes are typically distinguished from unsupervised machine learning processes by the use of labels in the learning process. For example, a classifier model is trained to classify data items. In the example of the system 100, the classifier model may be trained to classify images from the camera as including arcing or no arcing. A machine learning process trains the classifier model to correctly classify images from the camera. The machine learning process utilizes a training set of images that either include arcing or do not include arcing. The images are labeled to identify which images include arcing and which images do not include arcing. During the machine learning process, the classifier model is trained to classify the images in a way that matches the labels. In other words, the machine learning process trains the classifier model to correctly classify each image as including arcing or not including arcing. Accordingly, a supervised machine learning process trains a classifier analysis model to classify data items in a way that matches the labels. In this way, the machine learning process is a supervised process.

The supervised machine learning process for the analysis model of the control system 110 can include generating training set data. Generating the training set data can include gathering images or streams of images from known plasma discharge events. Generating the training set data can include gathering images known to not include plasma discharge events. The training set data can be labeled to identify images that represent arcing, and images that do not represent plasma discharge events.

The known arcing events for the training set data can include various types of plasma discharge events including arcing between various objects or positions within the clean environment 102, corona discharges, or sparking. The known plasma discharge events can also include plasma discharge events that contact the semiconductor wafer 104 or equipment that holds or supports the semiconductor wafer 104.

The supervised machine learning process can include passing the training set data through the analysis model. The analysis model classifies each video signal, or set of video signals, from the training set as either a plasma discharge event or as not a plasma discharge event. The classifications are then compared to the labels. The parameters or weights of one or more classification functions of the analysis model are adjusted and the images of the training set are passed through the analysis model again. The classifications are then compared to the labels and the functions are adjusted accordingly. This process repeats in iterations until the analysis model is able to reliably classify the images in a way that matches the labels.

In one embodiment, the images are converted to a vector form prior to being passed to the analysis model. Accordingly, the analysis model analyzes a vectorized representation of the images. Thus, analyzing the images with the analysis model can include analyzing vectorized versions of the images or other types of representations of the images.

In one embodiment, the analysis model includes a classifier model, a multiclass classifier model, or a binary classifier model. The analysis model can include a neural network-based classifier model. The classifier model can include a logistic regression model, a naïve Bayes model, a stochastic gradient descent model, a K-nearest neighbors model, a decision tree model, a random forest model, or other types of classifier models. The analysis model can also include other types of classifier models or models other than classifier models without departing from the scope of the present disclosure.

In one embodiment, the analysis model includes an unsupervised machine learning model. Unsupervised machine learning processes typically do not include labeled data. Thus, a training set for an unsupervised learning process includes data items for which there are not labels available. In this case, the training set may include many images of the interior of the semiconductor process chamber 102. The training set images include images with arcing and images with no arcing. However, unlike in the supervised machine learning process, the training set images do not include labels identifying which images include arcing and which images do not. In this case, the unsupervised machine learning process learns to group images that are similar with each other. The groups can later be identified as corresponding to arcing or no arcing. Accordingly, the unsupervised machine learning processes can train an analysis model to recognize patterns and similarities among data items. This can be used to cluster data items.

The analysis model of the control system 110 can be trained with an unsupervised machine learning process to recognize patterns within images that indicate arcing within the semiconductor process chamber 102. After training, the analysis model can be used to group images that are similar to each other. This can be used to cluster video images into arcing and non-arcing images.

As the control system 110 receives images, the images may be filtered or formatted and then provided to the analysis model. The analysis model analyzes the images and determines whether a portion of a video signal represents arcing within the semiconductor process chamber 102. The analysis model outputs an indication of arcing or no arcing for each video signal sample passed through the analysis model.

The control system 110 can utilize pattern recognition systems other than a machine learning analysis model in order to detect arcing based on the images. In one embodiment, a rules-based analysis model is encoded, by an expert, with rules that define how data items should be analyzed and classified. Thus, rather than training an analysis model with a machine learning process, a rules-based analysis model may be encoded to classify data items based on predetermined rules. The analysis model of the control system 110 can utilize a rules-based system to recognize arcing sounds. The control system 110 can utilize rules-based analysis systems or other types of analysis systems in order to identify time domain or frequency domain patterns or characteristics indicative of arcing within the clean environment 102. For example, rules-based analysis can include automatically reducing the voltage between the top and bottom electrodes responsive to detecting arcing, automatically adjusting a pressure with the semiconductor process chamber 102 responsive to detecting arcing, or automatically stopping semiconductor process responsive to detecting arcing.

In one embodiment, the control system 110 generates a 3D model of plasma discharge within the semiconductor process chamber 102. In particular, the control system 110 can receive video images from a plurality of cameras and can construct a 3D model of plasma discharge within the semiconductor process chamber. The multiple video streams from multiple locations/angles enables the control system 110 to generate the 3D model. The 3D model can be based on optical characteristics, thermal characteristics (via infrared imaging), or a combination of the optical and thermal characteristics. The analysis model of the control system 110 can analyze the 3D model and can determine whether abnormal plasma discharge is present, as well as the location of the plasma discharge based on the 3D model. The analysis model can perform pattern recognition processes on the 3D model.

In one embodiment, when the control system 110 identifies plasma discharge within the semiconductor process chamber 102, the control system 110 can take various real-time actions responsive to the plasma discharge. Actions can be taken by the control system 110 in order to reduce or otherwise manage the plasma discharge within the semiconductor process chamber 102 in real time.

In one embodiment, the control system 110 can determine whether or not the plasma discharge is at a level that is dangerous to the semiconductor wafer 104. If the plasma discharge is at a level that is not yet dangerous to the semiconductor wafer 104, the control system 110 may refrain from taking any corrective action. Alternatively, or additionally, the control system 110 may output a notification indicating non-dangerous levels of arcing within the semiconductor process chamber 102. The notification can be received and viewed by personnel that oversee semiconductor processes within the clean environment 102.

In one embodiment, the control system 110 can determine that the level of plasma discharge is dangerous. In this case, the control system 110 can take steps to reduce or avoid further plasma discharge within the semiconductor process chamber 102. The control system 110 can be communicatively coupled to the semiconductor processing equipment 106 or to equipment associated with the semiconductor processing equipment 106. The control system 110 can control the semiconductor processing equipment 106 to adjust parameters associated with the semiconductor process in order to reduce or avoid further arcing within the semiconductor process chamber 102.

In one example, the semiconductor process is a plasma-based process such as plasma etching, or plasma enhanced chemical vapor deposition or plasma enhanced physical vapor deposition. The semiconductor processing equipment 106 can include equipment that performs or facilitates the plasma-based process. The control system 110 can cause the semiconductor processing equipment 106 to adjust parameters of the plasma-based process. For example, plasma-based processes often apply high voltages within the semiconductor process chamber 102 or to gases that enter into the clean environment 102. The control system 110 can cause a reduction in these voltages in order to reduce or eliminate dangerous arcing within the semiconductor process chamber 102. Alternatively, the control system 110 can adjust other parameters of the plasma-based semiconductor process in order to reduce or eliminate dangerous arcing within the semiconductor process chamber 102.

In one example, arcing may occur between a wall of the semiconductor process chamber 102 and other equipment or material within the semiconductor process chamber 102. The arcing may be due to the buildup of dielectric material on a wall or on the equipment within the semiconductor process chamber 102. The control system 110 can cause an automated system to clean or otherwise remove dielectric material from portions of the clean environment 102 associated with the plasma discharge. This can help reduce arcing.

In one example, arcing may occur based, in part, on temperatures or deposition rates during various semiconductor processes. The control system 110 can reduce temperatures or adjust deposition rates within the clean environment 102 responsive to detecting arcing.

In one example, arcing may occur based, in part, on the concentrations of various types of gases within the semiconductor process chamber 102 during semiconductor processes. The control system 110 can cause the semiconductor processing equipment 106 to adjust the flow of one or more gases in the semiconductor process chamber 102 in order to reduce or avoid dangerous arcing.

In one embodiment, the control system 110 may cause the semiconductor processing equipment 106 to entirely stop a semiconductor process in response to detecting abnormal, unwanted, or dangerous plasma discharge within the semiconductor process chamber 102. In order to avoid serious damage to the semiconductor wafer 104, in some cases the control system 110 may determine that the best course of action is to stop the semiconductor process entirely until other adjustments can be made to reduce or prevent the abnormal plasma discharge within the semiconductor process chamber 102.

In one embodiment, the control system 110 can include portions external to the semiconductor process chamber 102, portions within the semiconductor process chamber 102, and/or portions executed within the cloud. Accordingly, the control system 110 may be distributed with various processing, memory, and data transmission resources in multiple locations. The control system 110 may also include virtual memory, processing, and data transmission resources in the cloud.

Figure 2:
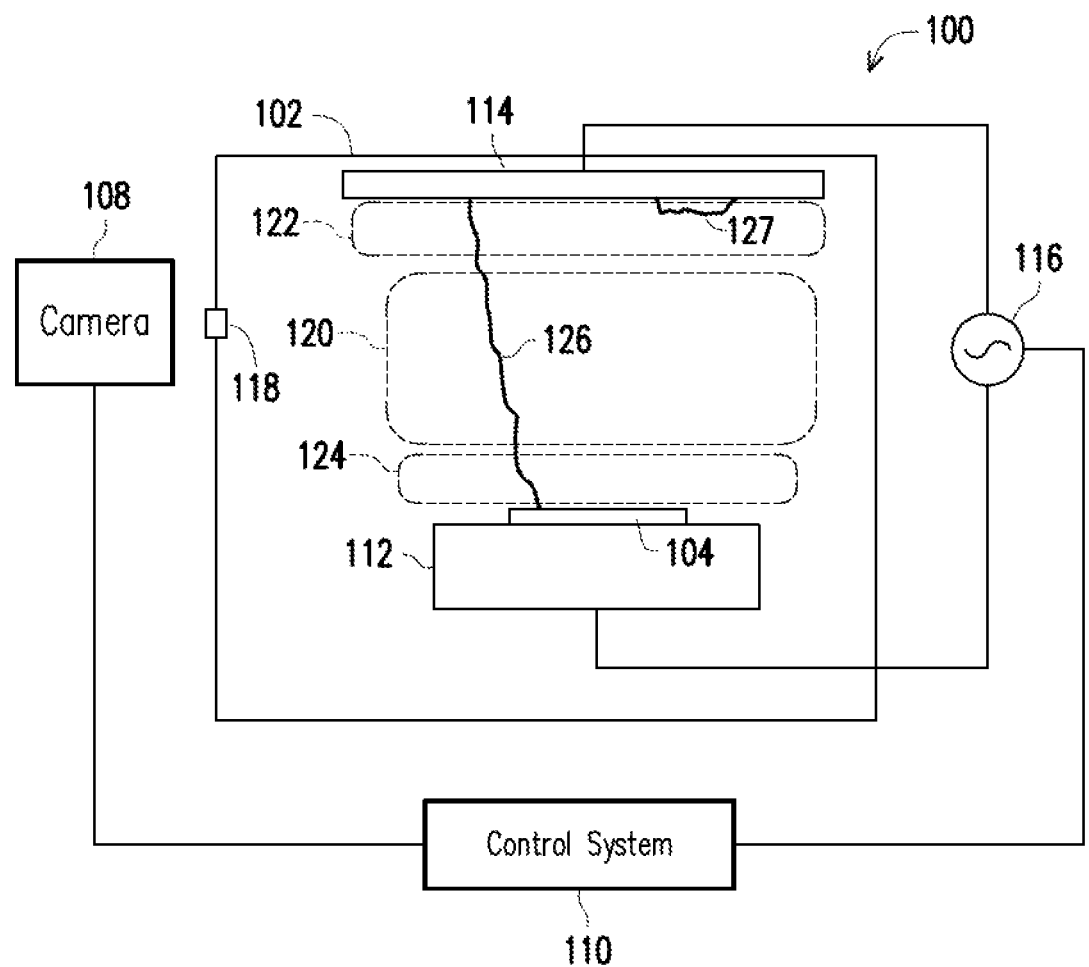
FIG. 2 is an illustration of a semiconductor processing system including a plasma discharge detection system, according to one embodiment.

FIG. 2 is an illustration of a semiconductor processing system 100, according to an embodiment. The semiconductor processing system 100 includes a semiconductor process chamber 102 including a top electrode 114, a bottom electrode 112, and a wafer 104 positioned on the bottom electrode 112. One or more cameras 108 are positioned within or outside of the semiconductor process chamber 102. A radiofrequency power source 116 is coupled to the top electrode 114 and the bottom electrode 112. The control system 110 is coupled to the camera 108 and the radiofrequency power source 116. The semiconductor processing system 100 detects abnormal or unwanted plasma discharge within the semiconductor process chamber 102. The bottom electrode 112, the top electrode 114, and the radio frequency power source 116 are examples of semiconductor process equipment of FIG. 1.

In one embodiment, the cameras 108 are positioned in various positions surrounding the semiconductor process chamber 102. The cameras 108 can be positioned above the semiconductor wafer 104 and below the bottom electrode 112. The bottom electrode 112 can also be a chuck configured to hold the wafer 104.

In one embodiment, the radiofrequency power source 116 drives the top electrode 114 and the bottom electrode 112 to generate a plasma in the plasma region 120 by applying an AC voltage in a radio frequency range between the top electrode 114 and the bottom electrode 112. The plasma can be generated from a gas within the semiconductor process chamber 102. The gas can include argon, oxygen, nitrogen, or other gases.

A glow discharge is associated with the plasma region 120. The optical and thermal characteristics of the glow discharge can depend on the type of gas and the type of semiconductor process associated with the plasma region 120. For example, etching processes, implantation processes, deposition processes, and other types of plasma-assisted semiconductor processes result in the plasma and in particular optical and thermal characteristics. The glow discharge can also depend on various process parameters such as DC voltage, radiofrequency power, pressure, temperature, etc. Abnormal discharge can be located by two or more spatial location comparison of images. Glow discharge video characteristics depend on processing wafer materials to pattern structure, to pattern density, and other factors.

In the example of FIG. 2, the plasma generation process results in an anode glow region 122 adjacent to the top electrode 114. In this example, the top electrode 114 is the anode. The plasma generation process also results in a cathode glow region 124 adjacent to the bottom electrode cathode. In this example, the bottom electrode 112 is the cathode. The main plasma region 120 is positioned between the anode glow region 122 and the cathode glow region 124.

In one embodiment, an abnormal or undesirable plasma discharge event can occur during plasma generation. For example, an arcing event 126 may occur between the top electrode 114 in the wafer 104. This arcing event can cause severe damage to a portion of the wafer or to the entire wafer 104. Another type of abnormal undesirable plasma discharge event that can occur is the corona discharge event 127 shown in FIG. 2.

The one or more cameras 108 can be positioned to capture video of the internal environment of the semiconductor process chamber 102. The video images, or image data resulting from the video images, is provided to the control system 110. The control system 110 analyzes the video images in order to detect the arcing event 126 and the corona discharge event 127. The control system 110 can identify the exact locations of the arcing event 126 and the corona discharge event 127. The control system 110 can then respond in real time to adjust parameters of the semiconductor process in order to reduce or eliminate undesirable plasma discharge events.

Figure 3:
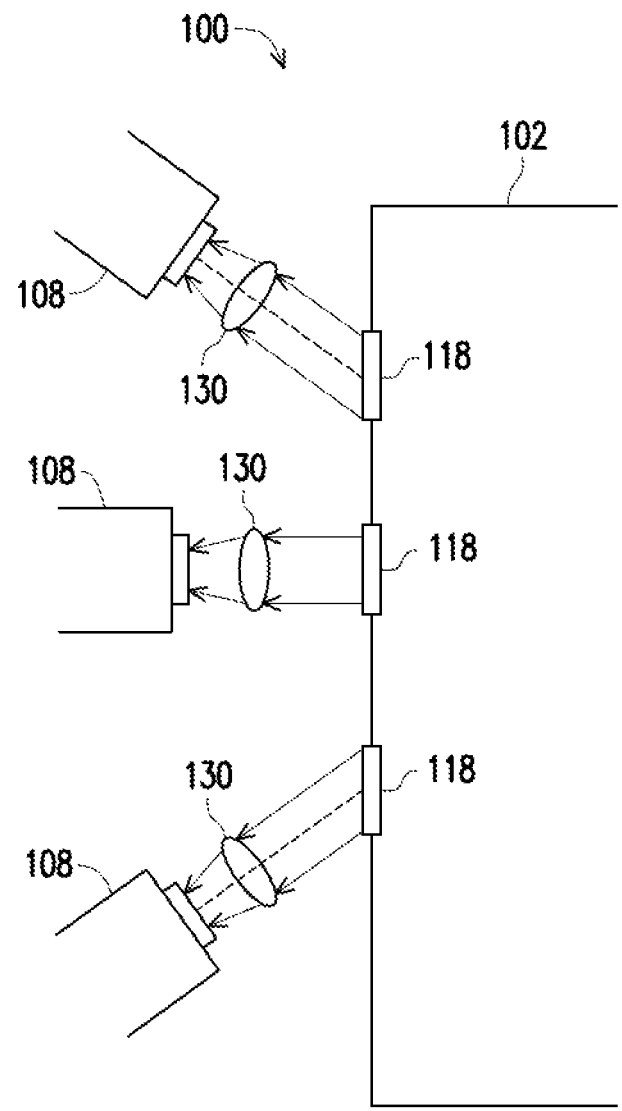
FIG. 3 is an illustration of camera placement in a semiconductor processing system, according to one embodiment.

FIG. 3 is an illustration of a portion of a semiconductor processing system 100, according to one embodiment. The semiconductor processing system 100 includes a semiconductor process chamber 102 and a plurality of cameras 108 positioned external to the semiconductor process chamber 102. The semiconductor process chamber 102 can include a plurality of apertures 118 that allow light to pass from an interior of the semiconductor process chamber 102 to the cameras 108. The apertures can correspond to transparent portions of the semiconductor process chamber 102. Alternatively, the semiconductor process chamber wall may be entirely transparent.

In one embodiment, the cameras 108 are positioned to capture images from a variety of angles. The positioning of the cameras 108 can also enable each camera 108 to focus on a particular area within the semiconductor process chamber 102. In one embodiment, each camera 108 shown in FIG. 2 can correspond to a group of cameras. Each group of cameras can include cameras that are sensitive to various spectra of light. For example, each group of cameras may include one or more cameras that are sensitive to infrared light. Each group of cameras may include one or more cameras that are sensitive to visible light. Each group of cameras may include one or more cameras that are sensitive to ultraviolet light. Additionally, or alternatively, each group of cameras 108 may include cameras that face in different directions.

In one embodiment, a plasma discharge event occurs at a particular area of the semiconductor wafer 104. Each of the cameras 108 receives light resulting from the arcing event 126. Each of the cameras 108 captures images based on the light. The cameras 108 can pass the images to a control system 110 (not shown in FIG. 3). The control system 110 can detect the plasma discharge event based on the images. The control system 110 can also identify the location of the plasma discharge event based on the images and the known positions of the cameras 108.

With reference to FIG. 2 and FIG. 3, in the example of FIG. 2, the arcing event 126 has contacted a particular portion of the semiconductor wafer 104. The control system 110 can identify the location of the arcing event 126 on the semiconductor wafer 104. The control system can determine that the arcing event 126 contacted the semiconductor wafer 104 because the analysis model can be trained to recognize the optical characteristics of arcing that contacts a semiconductor wafer. The control system can determine the location of the arcing event by analyzing the images from each of a plurality of cameras with known positions. The location of the arcing event 126 will correspond to a particular part of the semiconductor wafer 104. The particular location corresponds to one or more integrated circuit dies that will be separated from the semiconductor wafer 104. The control system 110 can flag the individual integrated circuits that will come from this area of the semiconductor wafer 104 as being potentially damaged. These integrated circuit dies can be discarded after dicing.

In one embodiment, the control system 110 can determine that the arcing event 126 likely caused significant damage to the semiconductor wafer 104 based on the characteristics of the images. The control system 110 can output an alert that a technician should inspect the semiconductor wafer 104. Alternatively, the control system can determine that the semiconductor wafer 104 should be discarded.

In one embodiment, the light emitted by an arcing event are different depending on various factors associated with the arcing event. For example, light associated with an arcing event can vary based on a type of gas present within the semiconductor process chamber 102 during thin-film growth or deposition process related to the semiconductor wafer 104. Arcing optical patterns can vary with process parameters such as a voltage present within the semiconductor process chamber 102 or a level of vacuum within the semiconductor process chamber 102. Arcing video patterns can vary with the type of semiconductor process including wet etching, dry etching, physical vapor deposition, chemical vapor deposition, or other types of processes. Arcing video patterns can vary based on the type of material that has been damaged, such as an oxide layer, a photoresist layer, a metal layer, a semiconductor layer, or other types of materials associated with the semiconductor wafer 104. Arcing video patterns can vary based on the type of damage such as the size of a damaged area, the shape of a damaged area, or other factors associated with a damage result. Arcing video patterns can vary based on the occurrence of chipping of the semiconductor wafer 104 or other structures or equipment positioned within the semiconductor process chamber 102.

The control system 110 can be trained to recognize optical patterns associated with all the various parameters of arcing events. The control system 110 can make diagnoses and can adjust parameters of semiconductor processes based on the particular optical and thermal patterns associated with the various types of arcing events.

In one embodiment, the control system 110 can sense whether an arcing event has contacted the wafer support 116. The control system 110 can sense a location on the wafer support 116 that was affected by an arcing event. The location can be detected based on the images and the known positions of the cameras 108. The control system 110 can detect arcing and location of arcing in other locations and relative to other materials or equipment positioned within the semiconductor process chamber 102.

Though not shown in FIG. 3, each camera 108, or group of cameras, can be coupled to additional circuitry including wired or wireless communication devices, power sources, energy harvesting devices, filters, signal processors, or other electronic circuitry that can assist in the detection of arcing in the semiconductor process chamber 102.

In one embodiment, the semiconductor processing system 100 can include optical systems 130. The optical systems 130 can include various optical elements for guiding, focusing, or conditioning light from the interior of the semiconductor process chamber 102. The optical systems 130 can direct light from the interior of the semiconductor process chamber 102 to the cameras 108. The optical systems 130 can include lenses, mirrors, waveguides, filters, polarizers, or other optical components configured to guide, focus, or condition light prior to reaching the cameras 108.

As described herein, optical characteristics of the present discharge events can include thermal characteristics. Electromagnetic radiation in the infrared spectrum is often highly indicative of thermal characteristics. Accordingly, a camera 108 is configured to capture infrared images. The captured images are representative of both optical and thermal properties of plasma discharge events.

In one embodiment, the cameras 108 can be directly coupled to the wall of the semiconductor process chamber 102. In this case, the cameras 108 may be positioned in or on the apertures 108. In one embodiment, the cameras 108 may be positioned partially or entirely within the semiconductor process chamber.

As set forth previously, the array of cameras 108 enables the control system 110 to generate a 3D model of plasma discharge within the semiconductor process chamber 102. The control system 110 can detect abnormal plasma discharge based on the 3D model.

Figure 4:
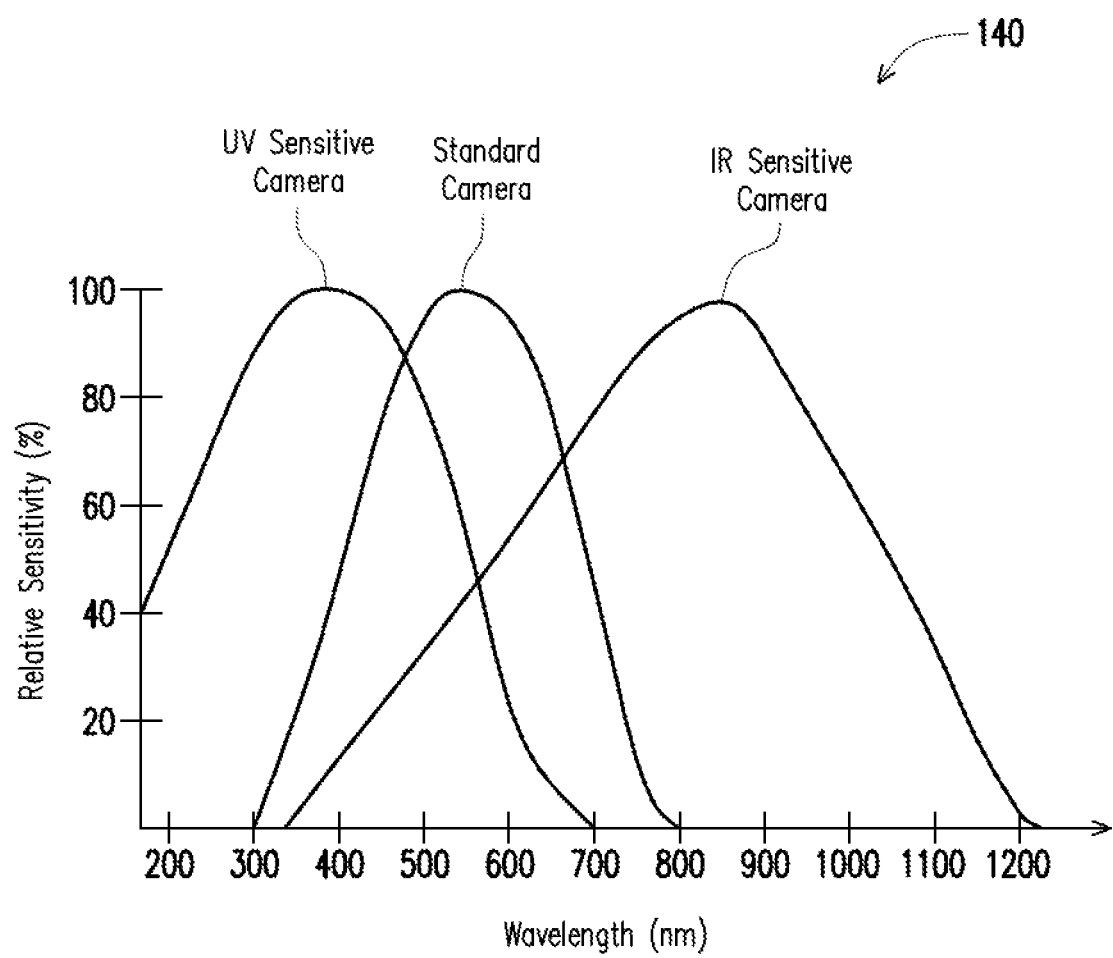
FIG. 4 illustrates a plurality of graphs indicating spectral sensitivity of various types of cameras, according to one embodiment.

FIG. 4 illustrates a graph 140 of the relative sensitivity percentage of various types of cameras per various portions of the electromagnetic spectrum, according to one embodiment. The cameras 108 can include ultraviolet sensitive cameras, standard cameras sensitive primarily to visible light, and infrared sensitive cameras primarily sensitive to infrared light. The curves shown in the graph 140 illustrate the respective sensitivities of the various types of cameras. In particular, in the example of FIG. 4, the ultraviolet sensitive camera is sensitive to light with wavelengths between 200 and 600 nm. The standard camera is sensitive to light with wavelengths between 400 and 700 nm. The infrared sensitive camera is sensitive to light with wavelengths between 600 and 1200 nm. Accordingly, the group of cameras collectively provides good sensitivity to light with wavelengths between 200 and 1200 nm. Cameras with sensitivity ranges other than those shown in FIG. 4 and described above can be utilized without departing from the scope of the present disclosure.

Figure 5:
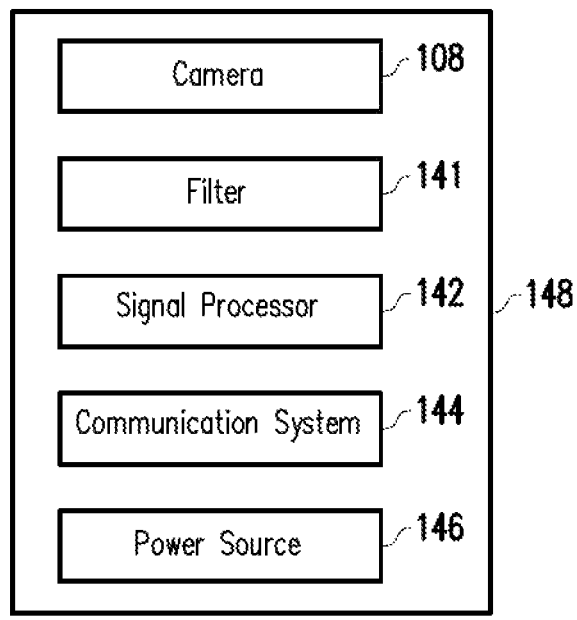
FIG. 5 is a block diagram of video signal output circuitry, according to one embodiment.

FIG. 5 is a block diagram of video signal output circuitry 148 of a semiconductor processing system 100, according to an embodiment. The video signal output circuitry 148 includes one or more cameras 108, a filter 141, a signal processor 142, a communication system 144, and a power source 146, according to one embodiment. The video signal output circuitry 148 can correspond to a circuitry package positioned within a semiconductor process chamber 102.

With reference to FIGS. 1-3 and 5, a semiconductor processing system 100 includes a plurality of cameras 108 positioned around or within the semiconductor process chamber 102. In one embodiment, the semiconductor processing system 100 can include, in the place of each camera 108 or group of cameras 108, a respective video signal output circuitry 148. Thus, each camera 108 or group of cameras 108 is part of a respective video signal output circuitry 148.

Each camera or group of cameras captures images, generates images and passes the images to a filter 141. The filter 141 filters selected optical characteristics or noise from the images and passes the filtered images to the signal processor 142. The signal processor 142 processes the images and provides the images to the communication system 144. The communication system 144 outputs the images to the control system 110. The communication system 144 can include a wireless communication system or a wired communication system. The power source 146 powers the video signal output circuitry 148. The power source 146 can include an energy harvesting device. Though not shown in FIG. 5, portions of the control system 110 can be included in the video signal output circuitry 148. The video signal output circuitry 148 can include other components or configurations without departing from the scope of the present disclosure.

Figure 6:
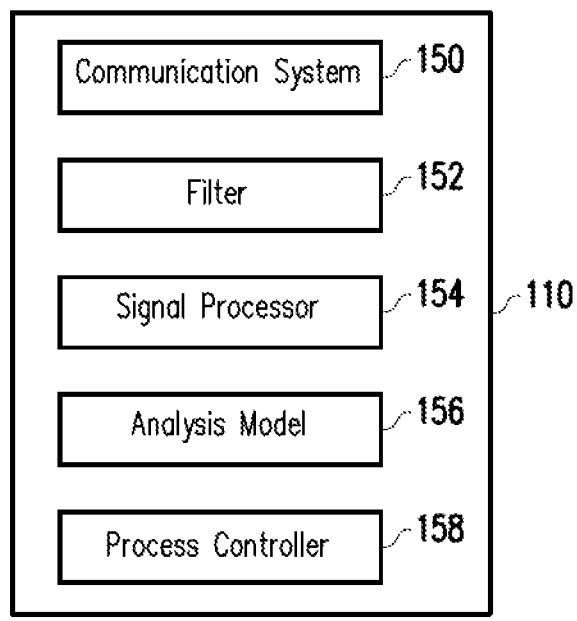
FIG. 6 is a block diagram of a control system of a plasma discharge detection system, according to one embodiment.

FIG. 6 is a block diagram of a control system 110 of a semiconductor processing system 100, according to an embodiment. The control system 110 includes a communication system 150, a filter 152, a signal processor 154, an analysis model 156, and a process controller 158.

The communication system 150 communicates with the cameras 108, or with the video signal output circuitry 148. The communication system 150 can include a wireless communication system that communicates wirelessly with the video signal output circuitry 148. The communication system 150 can include a wired communication system that communicates with the video signal output circuitry 148 via a wired connection. The communication system 150 receives images from the cameras 108.

The communication system 150 provides the images to the filter 152. The filter 152 can filter out optical characteristics or background noise from the images. The control system 110 can include multiple filters 152.

The signal processor 154 receives the images from the filter 152. The signal processor 154 processes the images. The signal processor 154 can place the images into a format that can be utilized by the analysis model 156.

The analysis model 156 analyzes the images and determines whether the images indicate that arcing has occurred within the semiconductor process chamber 102. The analysis model 126 can be trained with a machine learning process as described previously in relation to FIG. 1. The machine learning process can train the analysis model 126 to identify various types of plasma discharge within the semiconductor process chamber 102 based on the images.

The process controller 158 communicates with and controls the semiconductor processing equipment 106. For example, if the analysis model 156 indicates that unwanted plasma discharge is present within the semiconductor process chamber 102, then the process controller 158 can cause the semiconductor processing equipment 106 to adjust a semiconductor process in real time. The process controller 158 can also cause the semiconductor processing equipment 106 to stop a semiconductor process responsive to the detection of arcing within the semiconductor process chamber 102.

The control system 110 can include components and systems positioned within the semiconductor process chamber 102 as well as components positioned external to the semiconductor process chamber 102. Those of skill in the art will recognize, in light of the present disclosure, that a control system 110 can include other components and systems, or other configurations of components and systems without departing from the scope of the present disclosure.

Figure 7:
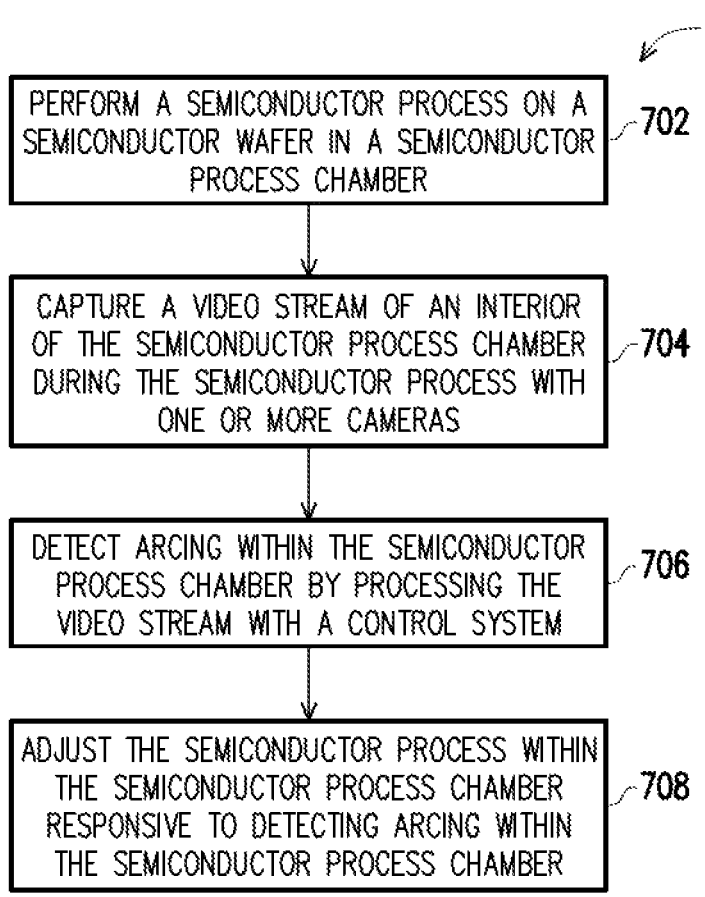
FIG. 7 is a flow diagram of a method for detecting plasma discharge within a semiconductor process chamber, according to one embodiment.

FIG. 7 is a flow diagram of a method 700 for detecting arcing within a semiconductor process chamber, according to an embodiment. At 702, the method 700 includes performing a semiconductor process on a semiconductor wafer in a semiconductor process chamber. One example of a semiconductor wafer is the semiconductor wafer 104 of FIG. 1. One example of a semiconductor process chamber is the semiconductor process chamber 102 of FIG. 1. At 704, the method 700 includes capturing a video stream during the semiconductor process with one or more cameras. One example of one or more cameras is the camera 108 of FIG. 1. At 706, the method includes detecting arcing within the semiconductor process chamber by processing the video stream with a control system. One example of a control system is the control system 110 of FIG. 1. At 708, the method 700 includes adjusting a semiconductor process within the semiconductor process chamber responsive to detecting the plasma discharge within the semiconductor process chamber.

Figure 8:
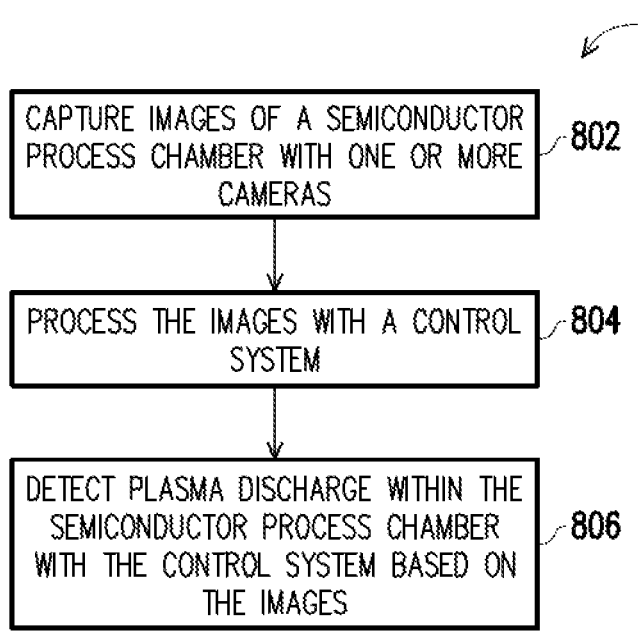
FIG. 8 is a flow diagram of a method for detecting plasma discharge within a semiconductor process chamber, according to one embodiment.

FIG. 8 is a flow diagram of a method 800 for detecting plasma discharge events within a semiconductor process chamber, according to an embodiment. At 802, the method 800 includes capturing images of a semiconductor process chamber with one or more cameras. One example of one or more cameras is the cameras 108 of FIG. 1. One example of a semiconductor process chamber is the semiconductor process chamber 102 of FIG. 1. At 804, the method 800 includes processing the images with a control system. One example of a control system is the control system 110 of FIG. 1. At 806, the method 800 includes detecting plasma discharge within the semiconductor process chamber with the control system based on the images.

In one embodiment, a method includes capturing images of a semiconductor process chamber with one or more cameras, processing the images with a control system, and detecting plasma discharge within the semiconductor process chamber with the control system based on the images.

In one embodiment, a system includes a semiconductor process chamber and one or more cameras positioned to capture images of the semiconductor process chamber. The system includes a control system communicatively coupled to the one or more cameras and configured to detect plasma discharge within the semiconductor process chamber based on the images and to adjust a semiconductor process responsive to detecting the plasma discharge.

In one embodiment, a method incudes performing a semiconductor process on a semiconductor wafer in a semiconductor process chamber, capturing a video stream during the semiconductor process with one or more cameras, and detecting arcing within the semiconductor process chamber by processing the video stream with a control system. The method includes adjusting the semiconductor process within the semiconductor process chamber responsive to detecting arcing within the semiconductor process chamber.

Embodiments of the present disclosure utilize plasma detection techniques to improve semiconductor processes. Capturing video streams of a semiconductor process chamber, analyzing the video streams with a control system, and identifying abnormal plasma discharge provides many benefits. For example, the control system can adjust parameters of the semiconductor process to reduce or eliminate unwanted plasma discharge in real time. This results in semiconductor processes that produce better uniformity in semiconductor wafers and their integrated circuits. Additionally, process yields are greatly increased because wafers are not damaged or scrapped due to abnormal plasma discharge.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method comprising:
performing a plasma assisted process on a wafer within a semiconductor process chamber including a top electrode and the wafer positioned on a bottom electrode, wherein the plasma assisted process generates an anode glow region adjacent to the top electrode, a cathode glow region adjacent to the bottom electrode and a plasma region between the anode glow region and the cathode glow region;
capturing, while performing the plasma assisted process, images of plasma within the semiconductor process chamber with a plurality of groups of cameras positioned around the semiconductor process chamber from different angles and positions, each group including an infrared camera, a visible light camera, and an ultraviolet camera;
processing the images with a control system;
generating a 3D model of the plasma within the semiconductor process chamber based on the images;
detecting, during the plasma assisted process, arcing between the top electrode and the wafer through the anode glow region, the plasma region, and the cathode glow region within the semiconductor process chamber with the control system based on the 3D model;
determining a location of the arcing on the wafer within the semiconductor processing chamber based on the images and angles and positions of the plurality of groups of cameras; and
adjusting, with the control system, the plasma assisted process during the plasma assisted process responsive to detecting the arcing.
2. The method of claim 1, wherein the capturing images includes:
capturing images in a visible light spectrum;
capturing images in an infrared spectrum; or
capturing images in an ultraviolet spectrum.
3. The method of claim 1, wherein the capturing images includes capturing infrared images, wherein processing the images includes generating a thermal distribution based on the infrared images.
4. The method of claim 3, further comprising detecting the arcing based on the thermal distribution.
5. The method of claim 1, wherein detecting the arcing includes determining, with the control system, that the images correspond to characteristics of arcing.
6. The method of claim 1, further comprising:
training an analysis model of the control system with a machine learning process to detect the arcing within the semiconductor process chamber; and
detecting arcing by analyzing the images with the analysis model.
7. A method, comprising:
performing a plasma assisted semiconductor process on a semiconductor wafer in a semiconductor process chamber including a top electrode and the semiconductor wafer positioned on a bottom electrode, wherein the plasma assisted process generates an anode glow region adjacent to the top electrode, a cathode glow region adjacent to the bottom electrode and a plasma region between the anode glow region and the cathode glow region;
capturing, with a plurality of groups of cameras positioned around the semiconductor process chamber from different angles and positions, a plurality of images of the semiconductor process chamber, each group including an infrared camera, a visible light camera and an ultraviolet camera;

generating a 3D model of the plasma within the semiconductor process chamber based on the images; detecting, during the plasma assisted semiconductor process with a control system communicatively coupled to the one or more cameras, arcing between the top electrode and the wafer through the anode glow region, the plasma region and the cathode glow region within the semiconductor process chamber based on the 3D model;

determining a location of the arcing on the semiconductor wafer within the semiconductor processing chamber based on the images and angles and positions of the cameras; and adjusting the semiconductor process within the semiconductor process chamber during the plasma assisted semiconductor process responsive to detecting arcing within the semiconductor process chamber.

8. The method of claim 7, comprising training an analysis model of the control system with a machine learning process to recognize the arcing based on the 3D model.

9. The method of claim 7, comprising wirelessly transmitting the images to the control system.

10. The method of claim 7, wherein adjusting the semiconductor process includes stopping the semiconductor process.

11. The method of claim 7, wherein adjusting the semiconductor process includes adjusting a voltage.

12. The method of claim 7, wherein adjusting the semiconductor process includes adjusting a flow rate of a fluid.

13. The method of claim 7, wherein the capturing images includes:

capturing images in a visible light spectrum;
capturing images in an infrared spectrum; or
capturing images in an ultraviolet spectrum.

14. The method of claim 13, wherein the capturing images includes capturing infrared images, wherein processing the images includes generating a thermal distribution based on the infrared images.

15. The method of claim 14, further comprising detecting the arcing based on the thermal distribution.

\* \* \* \* \*